US012812780B2

(12) United States Patent
Uchida

(10) Patent No.: US 12,812,780 B2
(45) Date of Patent: Nov. 24, 2026

(54) INTERCONNECT SUBSTRATE AND METHOD OF MAKING INTERCONNECT SUBSTRATE

(71) Applicant: SHINKO ELECTRIC INDUSTRIES CO., LTD., Nagano (JP)

(72) Inventor: Kensuke Uchida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 209 days.

(21) Appl. No.: 18/825,159

(22) Filed: Sep. 5, 2024

(65) Prior Publication Data

US 2025/0089168 A1 Mar. 13, 2025

(30) Foreign Application Priority Data

Sep. 11, 2023 (JP) ................................ 2023-147084

(51) Int. Cl.
*H05K 1/11* (2006.01)

(52) U.S. Cl.
CPC ... *H05K 1/116* (2013.01); *H05K 2201/09563* (2013.01); *H05K 2201/09827* (2013.01)

(58) Field of Classification Search
CPC ......... H05K 1/116; H05K 2201/09563; H05K 2201/09827
USPC .......................................................... 174/261
See application file for complete search history.

(56) References Cited

U.S. PATENT DOCUMENTS

2014/0353025 A1* 12/2014 Jang ....................... H05K 3/421 29/829
2020/0178392 A1* 6/2020 Hwang ................ H05K 3/0017
2021/0193609 A1* 6/2021 Hwang .................... H10P 72/74
2022/0248531 A1* 8/2022 Adachi .................. H05K 1/113
2022/0338347 A1* 10/2022 Adachi ................ H05K 3/4661

FOREIGN PATENT DOCUMENTS

JP 2022-164074 10/2022
JP 2022-165329 10/2022

* cited by examiner

*Primary Examiner* — Michael F Mcallister
(74) *Attorney, Agent, or Firm* — IPUSA, PLLC

(57) ABSTRACT

An interconnect substrate includes a first interconnect layer having a surface, the surface including a first region and a second region, an adhesion enhancing film covering the second region, an insulating layer formed on the adhesion enhancing film, a via hole formed through the insulating layer and the adhesion enhancing film to reach the first region, and a second interconnect layer formed on the insulating layer and in contact with the first region through the via hole, wherein a roughness of the first region is higher than a roughness of the second region.

6 Claims, 7 Drawing Sheets

INTERCONNECT SUBSTRATE AND METHOD OF MAKING INTERCONNECT SUBSTRATE

CROSS-REFERENCE TO RELATED APPLICATIONS

The present application is based on and claims priority to Japanese Patent Application No. 2023-147084 filed on Sep. 11, 2023, with the Japanese Patent Office, the entire contents of which are incorporated herein by reference.

FIELD

The disclosures herein relate to interconnect substrates and methods of making interconnect substrates.

BACKGROUND

Some interconnect substrates as proposed in the art may feature roughening treatment on the upper and side surfaces of an interconnect layer.

In a conventional interconnect substrate, an increase in the frequency of a signal transmitted through an interconnect layer may lower the reliability of the signal.

There may be a need for an interconnect substrate and a method of making the interconnect substrate which effectively suppresses the deterioration of signal reliability.

RELATED-ART DOCUMENT

Patent Document

[Patent Document 1] Japanese Laid-Open Patent Publication No. 2022-164074

[Patent Document 2] Japanese Laid-Open Patent Publication No. 2022-165329

SUMMARY

According to an aspect of the embodiment, an interconnect substrate includes a first interconnect layer having a surface, the surface including a first region and a second region, an adhesion enhancing film covering the second region, an insulating layer formed on the adhesion enhancing film, a via hole formed through the insulating layer and the adhesion enhancing film to reach the first region, and a second interconnect layer formed on the insulating layer and in contact with the first region through the via hole, wherein a roughness of the first region is higher than a roughness of the second region.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1A:
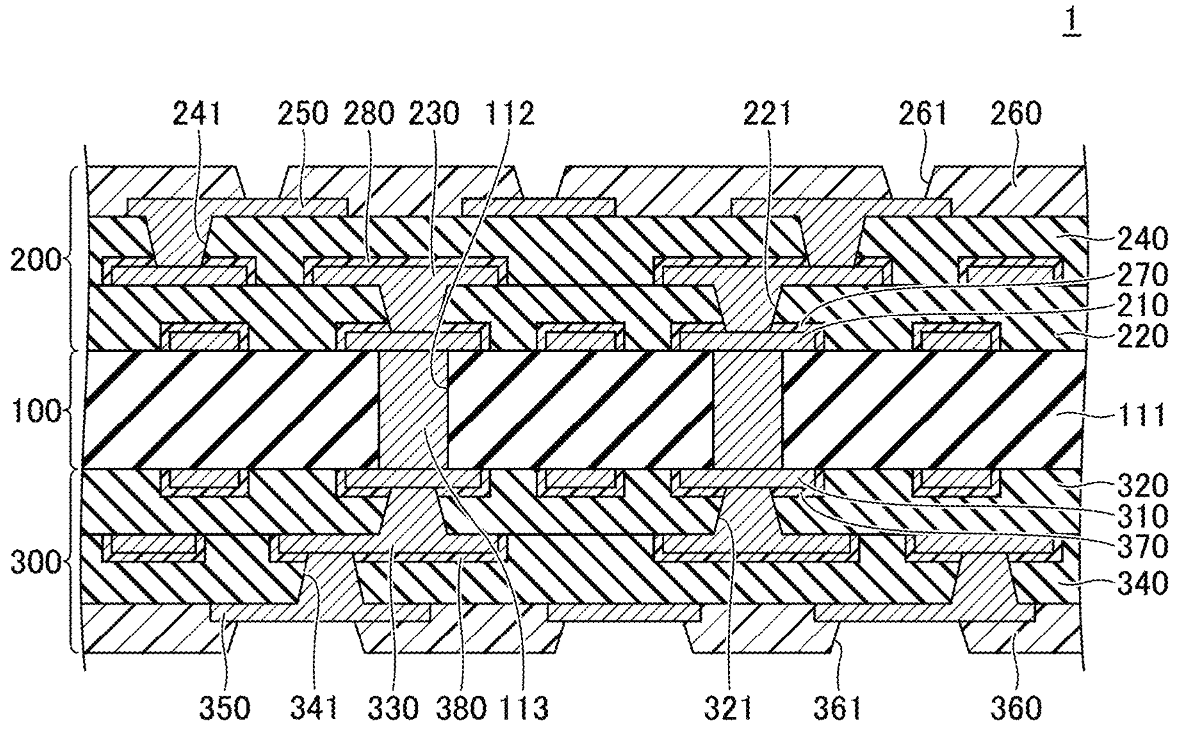
FIGS. 1A and 1B are cross-sectional views illustrating an interconnect substrate according to an embodiment.

In the following, an embodiment of the present disclosure will be specifically described with reference to the accompanying drawings. In the present specification and the drawings, components having substantially the same functional configuration may be denoted by the same reference numerals, and a duplicate description thereof may be omitted.

[Structure of Interconnect Substrate According to Embodiment]

Figure 1B:
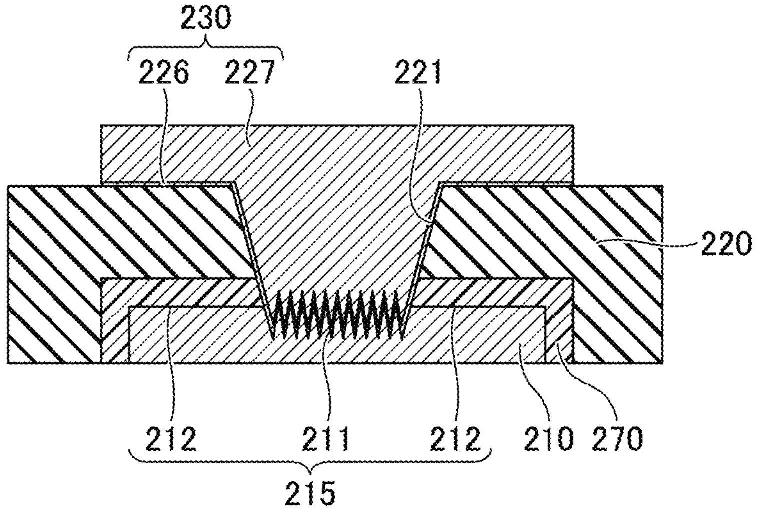

First, the structure of an interconnect substrate according to an embodiment will be described. FIGS. 1A and 1B are cross-sectional views illustrating the interconnect substrate according to the embodiment.

As illustrated in FIG. 1A, an interconnect substrate 1 according to the embodiment includes, for example, a core layer 100, a build-up layer 200 provided on one surface of the core layer 100, and a build-up layer 300 provided on the other surface of the core layer 100. The interconnect substrate 1 may alternatively be a coreless substrate including no core layer.

In this embodiment, for the sake of convenience, the build-up layer 200 side of the core layer 100 is referred to as an upper side or a first side, and the build-up layer 300 side is referred to as a lower side or a second side. The surface of a given portion on the upper side is referred to as s first surface or an upper surface, and the surface on the lower side is referred to as a second surface or a lower surface. It may be noted, however, that the interconnect substrate 1 may be used upside down, or may be arranged at any angle. The plan view refers to a view of an object as seen from the direction normal to the first surface of the core layer 100, and the plane shape refers to the shape of an object as seen from the direction normal to the first surface of the core layer 100.

The core layer 100 includes an insulating substrate 111 in which a plurality of through-holes 112 are formed, and a conductive layer 113 formed on the inner wall surface of each of the through-holes 112. The material of the substrate is, for example, glass epoxy or the like, and the material of the conductive layer 113 is, for example, copper (Cu) or the like. The core layer 100 may have a filling material filling inside the conductive layer 113.

The build-up layer 200 has interconnect layers 210, 230 and 250, insulating layers 220 and 240, a solder resist layer 260, and adhesion enhancing films 270 and 280. The build-up layer 300 has interconnect layers 310, 330 and 350, insulating layers 320 and 340, a solder resist layer 360, and adhesion enhancing films 370 and 380. The insulating layer 220 is provided between the interconnect layers 210 and 230 adjacent in the thickness direction, and the insulating layer 240 is provided between the interconnect layers 230 and 250 adjacent in the thickness direction. The insulating layer 320 is provided between the interconnect layers 310 and 330 adjacent in the thickness direction, and the insulating layer 340 is provided between the interconnect layers 330 and 350 adjacent in the thickness direction.

The interconnect layer 210 is formed on the first surface of the core layer 100. The interconnect layer 310 is formed on the second surface of the core layer 100. The interconnect layers 210 and 310 are electrically connected to each other through the conductive layer 113. The materials of the interconnect layers 210 and 310 and the conductive layer 113 are, for example, copper (Cu) or the like. The thicknesses of the interconnect layers 210 and 310 are, for example, each about 10 μm to 30 μm.

The adhesion enhancing film 270 is formed on the first surface and the side surfaces of the interconnect layer 210. The adhesion enhancing film 270 covers the first surface and the side surfaces of the interconnect layer 210. The adhesion enhancing film 270 is made of a material having two types of functional groups having different reactivity in one molecule. The material of the adhesion enhancing film 270 is, for example, a silane coupling agent or a titanium coupling agent. The thickness of the adhesion enhancing film 270 is, for example, about 3 nm to 8 nm.

In the silane coupling agent, the functional group chemically bonded to an organic material such as a resin preferably contains an amino group, an epoxy group, a mercapto group, an isocineate group, a methacryloxy group, an acryloxy group, a ureide group, or a sulfide group. An optimum functional group is selected in accordance with the type of resin chemically bonded to the silane coupling agent.

In the silane coupling agent, the functional group chemically bonded to an inorganic material such as a metal preferably contains an azole group, a silanol group, a methoxy group, or an ethoxy group. An optimum functional group is selected in accordance with the type of metal chemically bonded to the silane coupling agent.

The insulating layer 220 is formed on the first surface of the core layer 100 so as to cover the interconnect layer 210 and the adhesion enhancing film 270. The material of the insulating layer 220 is, for example, an insulating resin mainly composed of an epoxy-based resin or a polyimide-based resin. The thickness of the insulating layer 220 is, for example, about 30 μm to 40 μm. The insulating layer 220 may contain a filler such as silica ($SiO_2$). The content of the filler in the insulating layer 220 may be set as appropriate according to a required thermal expansion coefficient (CTE). The adhesion enhancing film 270 improves adhesion between the interconnect layer 210 and the insulating layer 220. That is, the adhesion enhancing film 270 provides higher adhesion between the interconnect layer 210 and the insulating layer 220 than when the interconnect layer 210 and the insulating layer 220 are in direct contact with each other.

At least one via hole 221 is formed in the insulating layer 220 and the adhesion enhancing film 270. The via hole 221 penetrates the insulating layer 220 and the adhesion enhancing film 270. The via hole 221 overlaps the interconnect layer 210 in a plan view and reaches the interconnect layer 210. The via hole 221 may be an inverted frustoconical recess. That is, the opening diameter of the via hole 221 at the upper end may be larger than the opening diameter at the lower end.

The interconnect layer 230 is formed on the first surface of the insulating layer 220. The interconnect layer 230 includes a via conductor in the via hole 221 and an interconnect pattern on the first surface of the insulating layer 220. The interconnect pattern of the interconnect layer 230 is electrically connected to the interconnect layer 210 via the via conductor. The material and thickness of the interconnect layer 230 are, for example, the same as those of the interconnect layer 210.

The adhesion enhancing film 280 is formed on the first surface and the side surfaces of the interconnect layer 230. The adhesion enhancing film 280 covers the first surface and the side surfaces of the interconnect layer 230. The material and thickness of the adhesion enhancing film 280 are, for example, the same as those of the adhesion enhancing film 270.

The insulating layer 240 is formed on the first surface of the insulating layer 220 so as to cover the interconnect layer 230 and the adhesion enhancing film 280. The material and thickness of the insulating layer 240 are, for example, the same as those of the insulating layer 220. The insulating layer 240 may contain a filler such as silica ($SiO_2$). The content of the filler in the insulating layer 240 is, for example, the same as that of the insulating layer 220. The adhesion enhancing film 280 improves the adhesion between the interconnect layer 230 and the insulating layer 240. That is, the adhesion enhancing film 280 provides higher adhesion between the interconnect layer 230 and the insulating layer 240 than when the interconnect layer 230 and the insulating layer 240 are in direct contact with each other.

At least one via hole 241 is formed in the insulating layer 240 and the adhesion enhancing film 280. The via hole 241 penetrates the insulating layer 240 and the adhesion enhancing film 280. The via hole 241 overlaps the interconnect layer 230 in plan view and reaches the interconnect layer 230. The via hole 241 may be an inverted frustoconical recess. That is, the opening diameter of the via hole 241 at the upper end may be larger than the opening diameter at the lower end.

The interconnect layer 250 is formed on the first surface of the insulating layer 240. The interconnect layer 250 includes a via conductor in the via hole 241 and an interconnect pattern on the first surface of the insulating layer 240. The interconnect pattern of the interconnect layer 250 is electrically connected to the interconnect layer 230 via the via conductor. The material and thickness of the interconnect layer 250 are, for example, the same as those of the interconnect layer 210. An adhesion enhancing film (not illustrated) may optionally be formed on the first surface and the side surfaces of the interconnect layer 250.

The solder resist layer 260 is formed on the first surface of the insulating layer 240 so as to cover the interconnect layer 250. At least one opening 261 is formed in the solder resist layer 260. The opening 261 penetrates the solder resist layer 260. The opening 261 overlaps an electrode pad that is part of the interconnect layer 250 in a plan view, and reaches the electrode pad.

The adhesion enhancing film 370 is formed on the second surface and the side surfaces of the interconnect layer 310. The adhesion enhancing film 370 covers the second surface and the side surfaces of the interconnect layer 310. The material and thickness of the adhesion enhancing film 370 are, for example, the same as those of the adhesion enhancing film 270.

The insulating layer 320 is formed on the second surface of the core layer 100 so as to cover the interconnect layer 310 and the adhesion enhancing film 370. The material and thickness of the insulating layer 320 are, for example, the same as those of the insulating layer 220. The insulating layer 320 may contain a filler such as silica ($SiO_2$). The content of the filler in the insulating layer 320 is, for example, the same as that of the insulating layer 220. The adhesion enhancing film 370 improves the adhesion between the interconnect layer 310 and the insulating layer 320. That is, the adhesion enhancing film 370 provides higher adhesion between the interconnect layer 310 and the insulating layer 320 than when the interconnect layer 310 and the insulating layer 320 are in direct contact with each other.

At least one via hole 321 is formed in the insulating layer 320 and the adhesion enhancing film 370. The via hole 321 penetrates the insulating layer 320 and the adhesion enhancing film 370. The via hole 321 overlaps the interconnect layer 310 in plan view and reaches the interconnect layer 310. The via hole 321 may be a frustoconical recess. That is, the opening diameter of the via hole 321 at the lower end may be larger than the opening diameter at the upper end.

The interconnect layer 330 is formed on the second surface of the insulating layer 320. The interconnect layer 330 includes a via conductor in the via hole 321 and an interconnect pattern on the second surface of the insulating layer 320. The interconnect pattern of the interconnect layer 330 is electrically connected to the interconnect layer 310 via the via conductor. The material and thickness of the interconnect layer 330 are, for example, the same as those of the interconnect layer 210.

The adhesion enhancing film 380 is formed on the second surface and the side surfaces of the interconnect layer 330. The adhesion enhancing film 380 covers the second surface and the side surfaces of the interconnect layer 330. The material and thickness of the adhesion enhancing film 380 are, for example, the same as those of the adhesion enhancing film 270.

The insulating layer 340 is formed on the second surface of the insulating layer 320 so as to cover the interconnect layer 330 and the adhesion enhancing film 380. The material and thickness of the insulating layer 340 are, for example, the same as those of the insulating layer 220. The insulating layer 340 may contain a filler such as silica ($SiO_2$). The content of the filler in the insulating layer 340 is, for example, the same as that of the insulating layer 220. The adhesion enhancing film 380 improves the adhesion between the interconnect layer 330 and the insulating layer 340. That is, the adhesion enhancing film 380 provides higher adhesion between the interconnect layer 330 and the insulating layer 340 than when the interconnect layer 330 and the insulating layer 340 are in direct contact with each other.

At least one via hole 341 is formed in the insulating layer 340 and the adhesion enhancing film 380. The via hole 341 penetrates the insulating layer 340 and the adhesion enhancing film 380. The via hole 341 overlaps the interconnect layer 330 in plan view and reaches the interconnect layer 330. The via hole 341 may be a frustoconical recess. That is, the opening diameter of the via hole 341 at the lower end may be larger than the opening diameter at the upper end.

The interconnect layer 350 is formed on the second surface of the insulating layer 340. The interconnect layer 350 includes a via conductor in the via hole 341 and an interconnect pattern on the second surface of the insulating layer 340. The interconnect pattern of the interconnect layer 350 is electrically connected to the interconnect layer 330 via the via conductor. The material and thickness of the interconnect layer 350 are, for example, the same as those of the interconnect layer 210. An adhesion enhancing film (not illustrated) may optionally be formed on the second surface and the side surfaces of the interconnect layer 350.

The solder resist layer 360 is formed on the second surface of the insulating layer 340 so as to cover the interconnect layer 350. At least one opening 361 is formed in the solder resist layer 360. The opening 361 penetrates the solder resist layer 360. The opening 361 overlaps an electrode pad that is part of the interconnect layer 350 in plan view, and reaches the electrode pad.

The interconnect layer 210, the adhesion enhancing film 270, the insulating layer 220, and the interconnect layer 230 will now be described in more detail.

As illustrated in FIG. 1B, the upper surface 215 of the interconnect layer 210 includes a first region 211 and a second region 212. The first region 211 is, for example, surrounded by the second region 212. The via hole 221 reaches the first region 211. The second region 212 is covered with the adhesion enhancing film 270, and the first region 211 is not covered with the adhesion enhancing film 270. The roughness of the first region 211 is higher than that of the second region 212. For example, the first arithmetic mean roughness Ra of the first region 211 is higher than the second arithmetic mean roughness Ra of the second region 212. The first arithmetic mean roughness Ra is, for example, from 80 nm to 250 nm, and the second arithmetic mean roughness is, for example, from 10 nm to 100 nm. Preferably, the first arithmetic mean roughness Ra is from 90 nm to 150 nm, and the second arithmetic mean roughness is from 20 nm to 60 nm.

The interconnect layer 230 is in contact with the first region 211, the inner wall surface of the via hole 221, and the first surface of the insulating layer 220. The interconnect layer 230 is not in contact with the second region 212. In other words, the region of the upper surface 215 with which the interconnect layer 230 is in contact is the first region 211, and the region with which the interconnect layer 230 is not in contact is the second region 212. The interconnect layer 230 includes a seed layer 226 and a plating layer 227. The plating layer 227 is in contact with the first surface of the seed layer 226.

The interconnect layer 230, the adhesion enhancing film 280, the insulating layer 240, and the interconnect layer 250 are also laminated on one another in the same manner as the interconnect layer 210, the adhesion enhancing film 270, the insulating layer 220, and the interconnect layer 230. The interconnect layer 310, the adhesion enhancing film 370, the insulating layer 320, and the interconnect layer 330 are also laminated on one another in the same manner as the interconnect layer 210, the adhesion enhancing film 270, the insulating layer 220, and the interconnect layer 230. The interconnect layer 330, the adhesion enhancing film 380, the insulating layer 340, and the interconnect layer 350 are also laminated on one another in the same manner as the interconnect layer 210, the adhesion enhancing film 270, the insulating layer 220, and the interconnect layer 230.

[Method of Making Interconnect Substrate According to Embodiment]

In the following, a method of making the interconnect substrate 1 according to the embodiment will be described. FIGS. 2A through 2C to FIGS. 4A and 4B are cross-sectional views illustrating the method of making the interconnect substrate according to the embodiment.

Figure 2A:
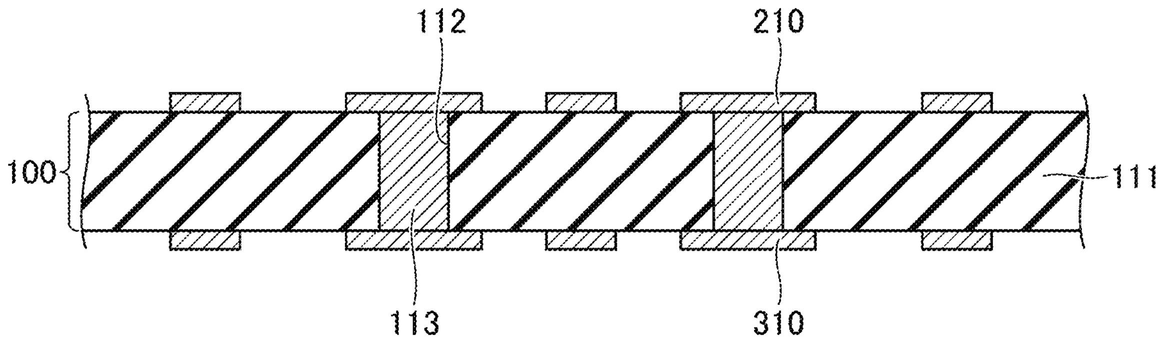
FIGS. 2A through 2C are cross-sectional views illustrating a method of making the interconnect substrate according to the embodiment.

First, as illustrated in FIG. 2A, a laminate of a core layer 100, an interconnect layer 210, and an interconnect layer 310 is prepared. The core layer 100 includes an insulating substrate 111 with through-holes 112 formed therein, and a conductive layer 113.

Figure 2B:
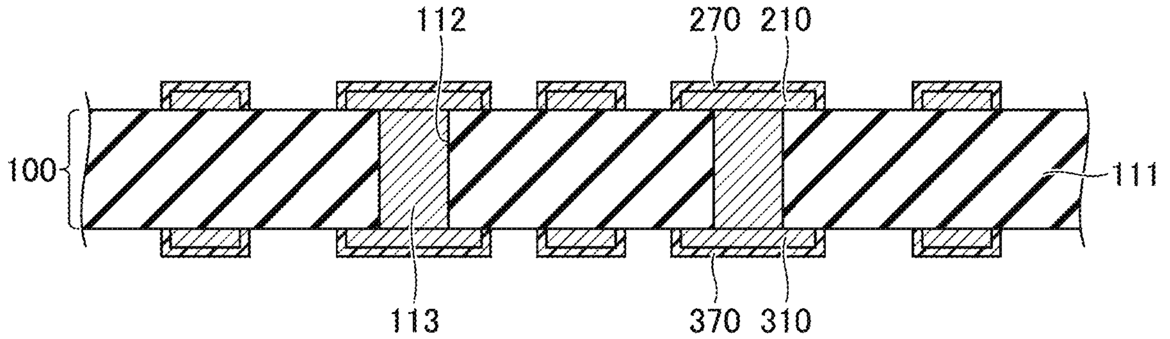

Next, as illustrated in FIG. 2B, an adhesion enhancing film 270 is formed on the upper surface and the side surfaces of the interconnect layer 210, and an adhesion enhancing film 370 is formed on the lower surface and the side surfaces of the interconnect layer 310. The adhesion enhancing films 270 and 370 are formed of, for example, a silane coupling agent.

In order to form the adhesion enhancing films 270 and 370 using a silane coupling agent, for example, the structure illustrated in FIG. 2A may be immersed in a diluted solution of the silane coupling agent. Alternatively, the adhesion enhancing film 270 may be formed by spray-coating the upper surface and the side surfaces of the interconnect layer 210 of the structure illustrated in FIG. 2A with a diluted solution of the silane coupling agent, and the adhesion enhancing film 370 may be formed by spray-coating the lower surface and the side surfaces of the interconnect layer 310 with a diluted solution of the silane coupling agent. The concentration of the diluted solution of the silane coupling agent is 0.1% to 10%, preferably 0.5% to 5%. At this stage, the thickness of the adhesion enhancing films 270 and 370 may be about 20 nm to 30 nm, for example, at the thickest part. Thereafter, the adhesion enhancing films 270 and 370 are washed with water, partially removed using a removal treatment solution such as an acidic solution, and dried in this order. As a result, the adhesion enhancing films 270 and 370 having a thickness of approximately 3 nm to 8 nm are obtained.

Figure 2C:
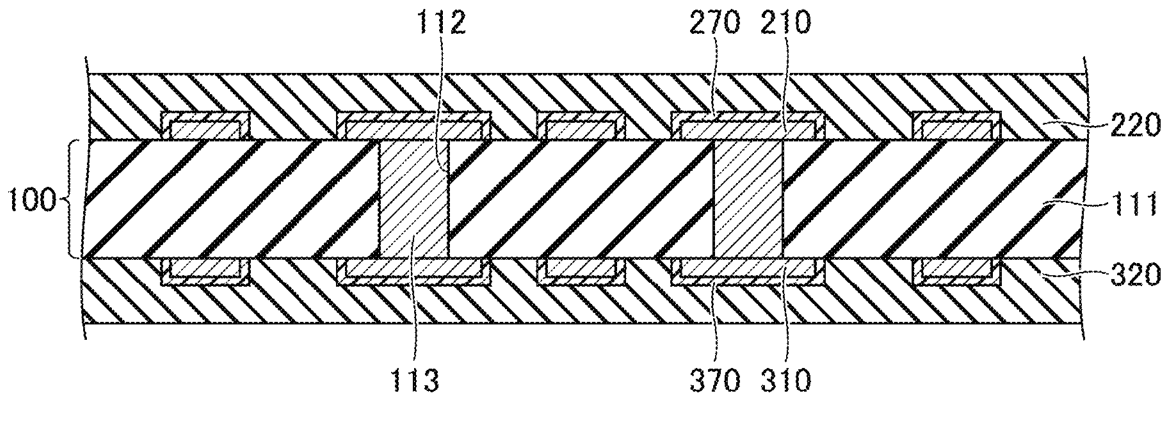

After the adhesion enhancing films 270 and 370 are formed, as illustrated in FIG. 2C, an uncured resin film is attached to the first surface of the core layer 100 so as to cover the interconnect layer 210 and the adhesion enhancing film 270, and an uncured resin film is attached to the second surface of the core layer 100 so as to cover the interconnect layer 310 and the adhesion enhancing film 370. Subsequently, these resin films are heat-treated and cured to form the insulating layers 220 and 320. The insulating layers 220 and 320 are formed of an insulating resin such as epoxy resin or polyimide resin. Alternatively, a liquid resin may be applied to form the insulating layers 220 and 320.

Figure 3A:
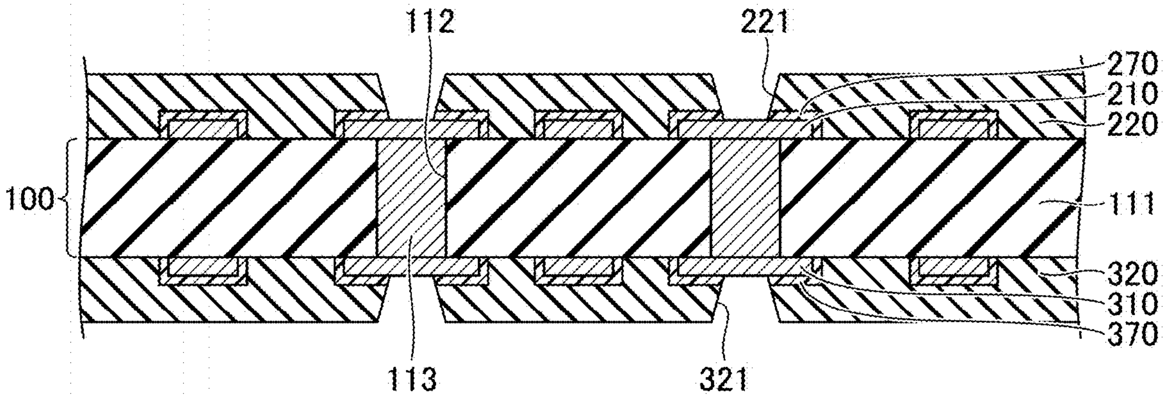
FIGS. 3A through 3C are cross-sectional views illustrating the method of making the interconnect substrate according to the embodiment.

Thereafter, as illustrated in FIG. 3A, via holes 221 reaching the interconnect layer 210 are formed in the insulating layer 220 and the adhesion enhancing film 270, and via holes 321 reaching the interconnect layer 310 are formed in the insulating layer 320 and the adhesion enhancing film 370.

Figure 3B:
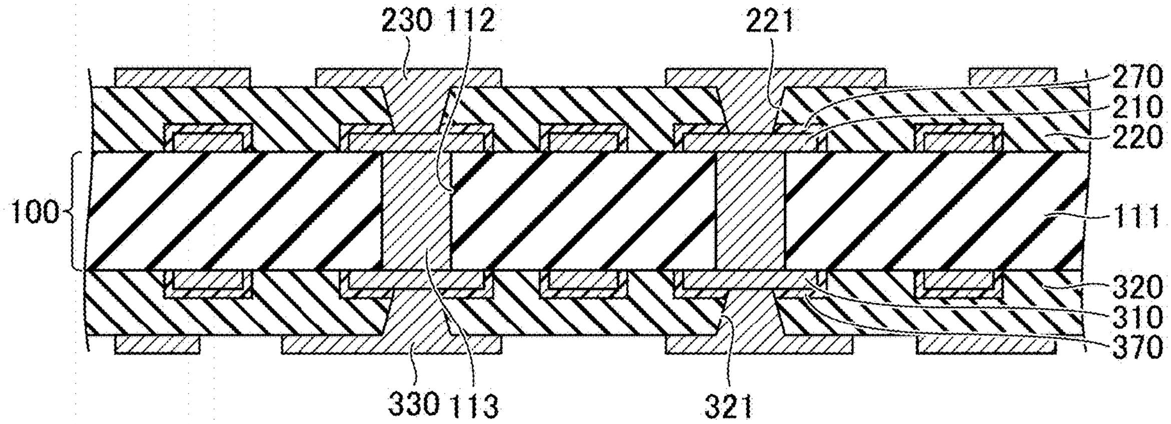

Subsequently, as illustrated in FIG. 3B, an interconnect layer 230 including via conductors in the via holes 221 and an interconnect pattern on the first surface of the insulating layer 220 is formed, and an interconnect layer 330 including via conductors in the via holes 321 and an interconnect pattern on the second surface of the insulating layer 320 is formed.

A method of forming the via holes 221 and the interconnect layer 230 will now be described. FIGS. 5A through 5D and FIGS. 6A through 6C are cross-sectional views illustrating a method of forming the via holes and the interconnect layer.

Figure 5A:
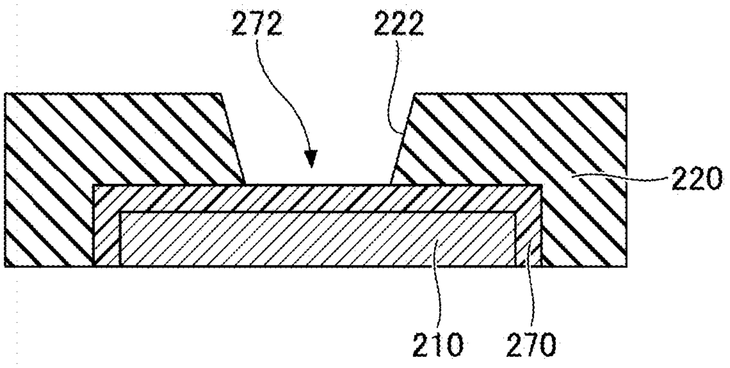
FIGS. 5A through 5D are cross-sectional views illustrating a method of forming a via hole and an interconnect layer.

First, as illustrated in FIG. 5A, an opening 222 is formed in the insulating layer 220 by processing the insulating layer 220 with a laser, so that the adhesion enhancing film 270 is exposed from the insulating layer 220. Alternatively, the insulating layer 220 may be processed using a drill. After the formation of the opening 222, preferably, a desmearing process is performed. As a result of the formation of the opening 222, the adhesion enhancing film 270 includes an exposed portion 272 exposed in the opening 222.

Figure 5B:
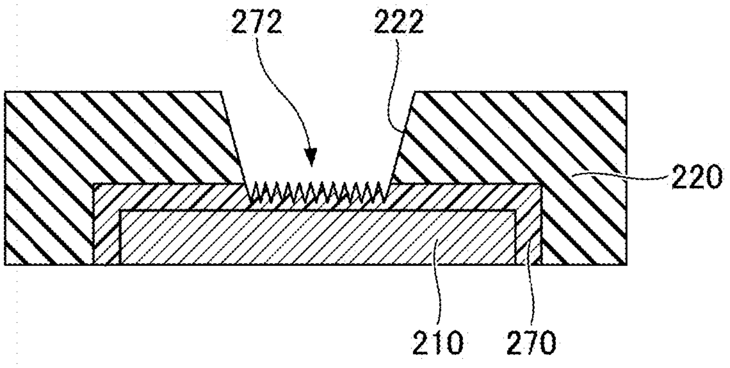
Figure 7A:
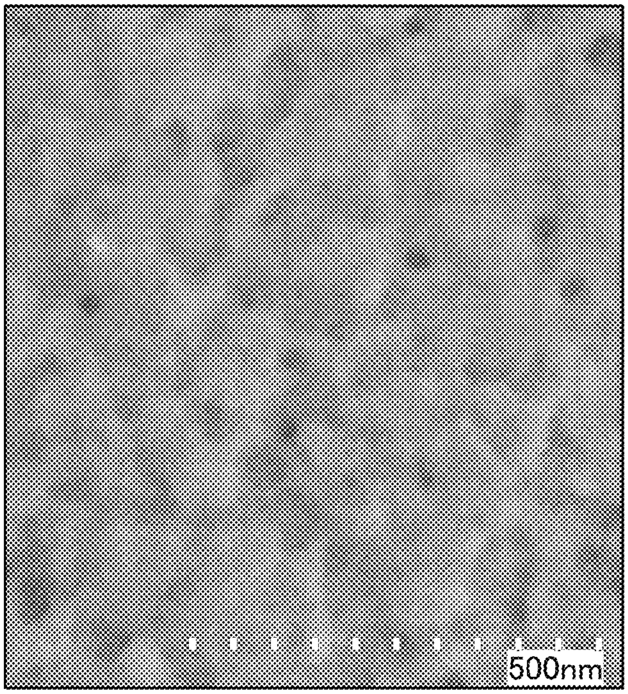
FIGS. 7A and 7B are views illustrating a change in the inside of an opening caused by plasma processing.
Figure 7B:
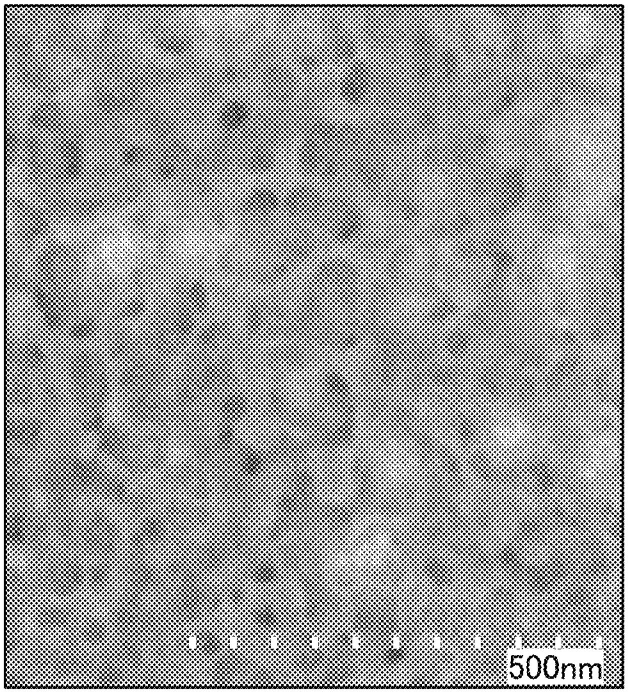

Next, as illustrated in FIG. 5B, the exposed portion 272 is roughened. In the roughening of the exposed portion 272, for example, the exposed portion 272 is irradiated with oxygen plasma. As a result, fine surface irregularities are formed in the exposed portion 272. In other words, the portion of the adhesion enhancing film 270 exposed in the opening 222 becomes fibrous. FIGS. 7A and 7B are views illustrating changes in the inside of the opening resulting from the plasma treatment. FIG. 7A illustrates an example of a state before oxygen plasma irradiation, and FIG. 7B illustrates an example of a state after oxygen plasma irradiation. FIGS. 7A and 7B are SEM images observed with a scanning electron microscope (SEM).

Figure 5C:
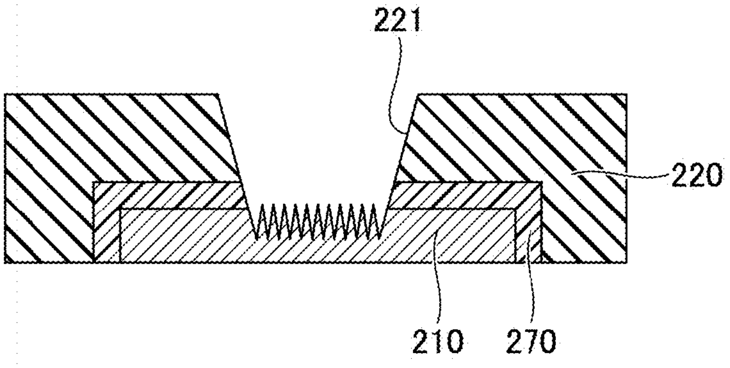

After roughening the exposed portion 272, reverse sputtering is performed on the upper surface 215 of the interconnect layer 210 through the roughened exposed portion 272, thereby forming a via hole 221 including the opening 222 and reaching the upper surface 215, as illustrated in FIG. 5C. In this reverse sputtering, the removal of the exposed portion 272 and the removal of the interconnect layer 210 proceed simultaneously, so that the upper surface 215 of the interconnect layer 210 has the same shape as the roughened exposed portion 272. The reverse sputtering process may use argon ions, for example.

It may be noted that the opening 222 is formed so that the via hole 221 reaches the first region 211 of the upper surface 215.

Figure 5D:
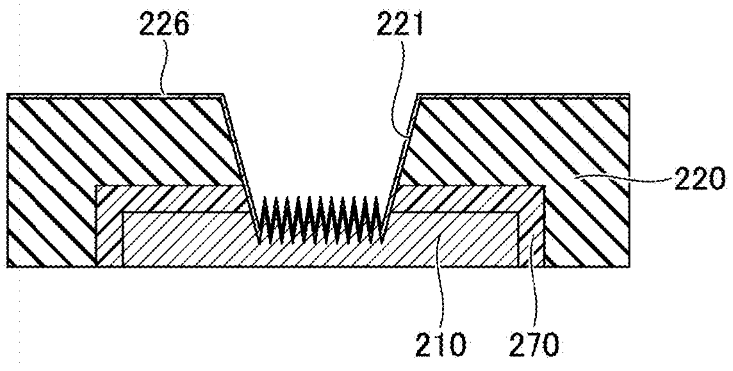

After the via hole 221 is formed, as illustrated in FIG. 5D, a seed layer 226 made of copper or the like is formed on the upper surface of the insulating layer 220, the inner wall surface of the via hole 221, and the first region 211 by sputtering. Alternatively, electroless plating may be used to form the seed layer 226.

Figure 6A:
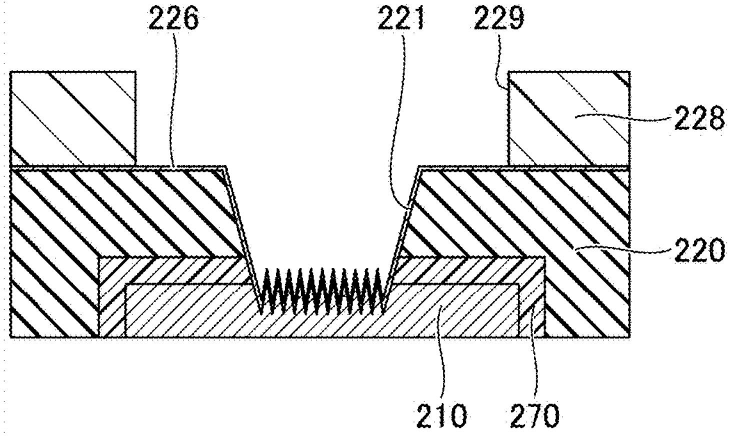
FIGS. 6A through 6C are cross-sectional views illustrating the method of forming the via hole and the interconnect layer.

As illustrated in FIG. 6A, a plating resist layer 228 is formed on the seed layer 226. The plating resist layer 228 is then exposed to light and developed to form an opening 229 in the plating resist layer 228.

Figure 6B:
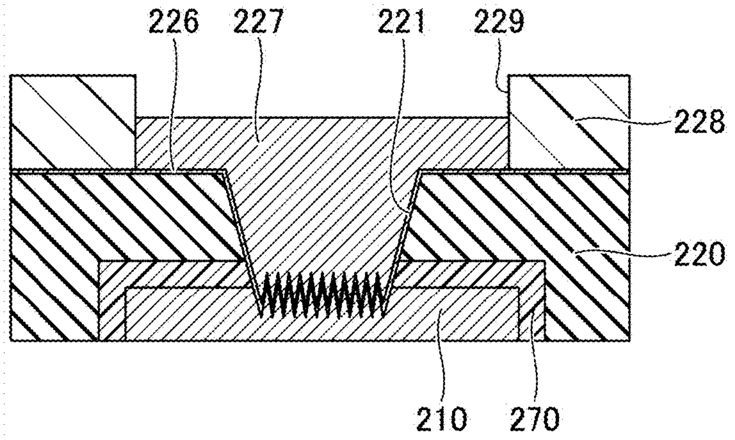

Subsequently, as illustrated in FIG. 6B, a plating layer 227 made of copper or the like is formed in the opening 229 of the plating resist layer 228 by electrolytic plating using the seed layer 226 as a plating feed path.

Figure 6C:
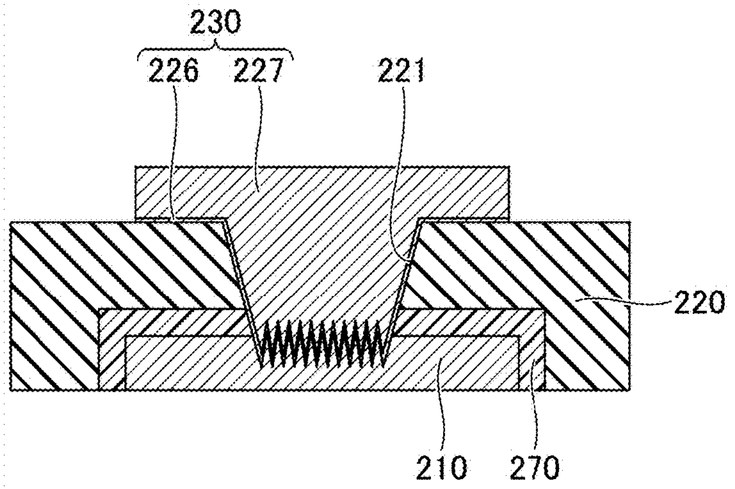

As illustrated in FIG. 6C, the plating resist layer 228 is removed. Further, the seed layer 226 is removed by flash etching using the plating layer 227 as a mask. Following these steps achieves the fabrication of the interconnect layer 230 including the seed layer 226 and the plating layer 227.

The via hole 321 and the interconnect layer 330 can also be formed by the same method as the via hole 221 and the interconnect layer 230.

Figure 3C:
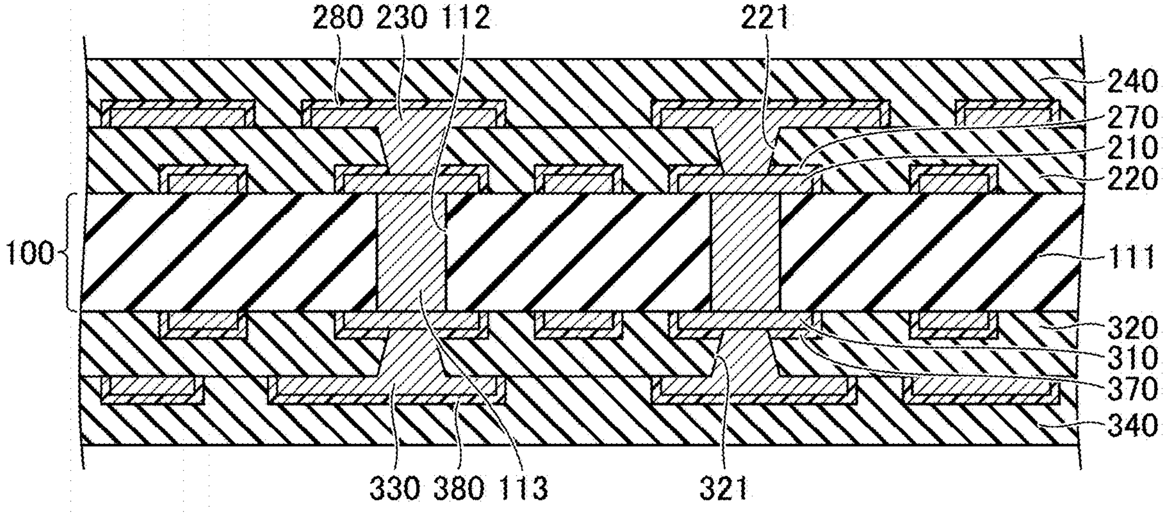

After the formation of the interconnect layers 230 and 330, as illustrated in FIG. 3C, the adhesion enhancing film 280 is formed on the upper surface and the side surfaces of the interconnect layer 230, and the adhesion enhancing film 380 is formed on the lower surface and the side surfaces of the interconnect layer 330. The adhesion enhancing films 280 and 380 may be formed by the same method as the adhesion enhancing films 270 and 370. An insulating layer 240 is then formed on the insulating layer 220 so as to cover the interconnect layer 230 and the adhesion enhancing film 280. An insulating layer 340 is also formed beneath the insulating layer 320 so as to cover the interconnect layer 330 and the adhesion enhancing film 380. The insulating layers 240 and 340 may be formed by the same method as the insulating layer 220 and the insulating layer 320.

Figure 4A:
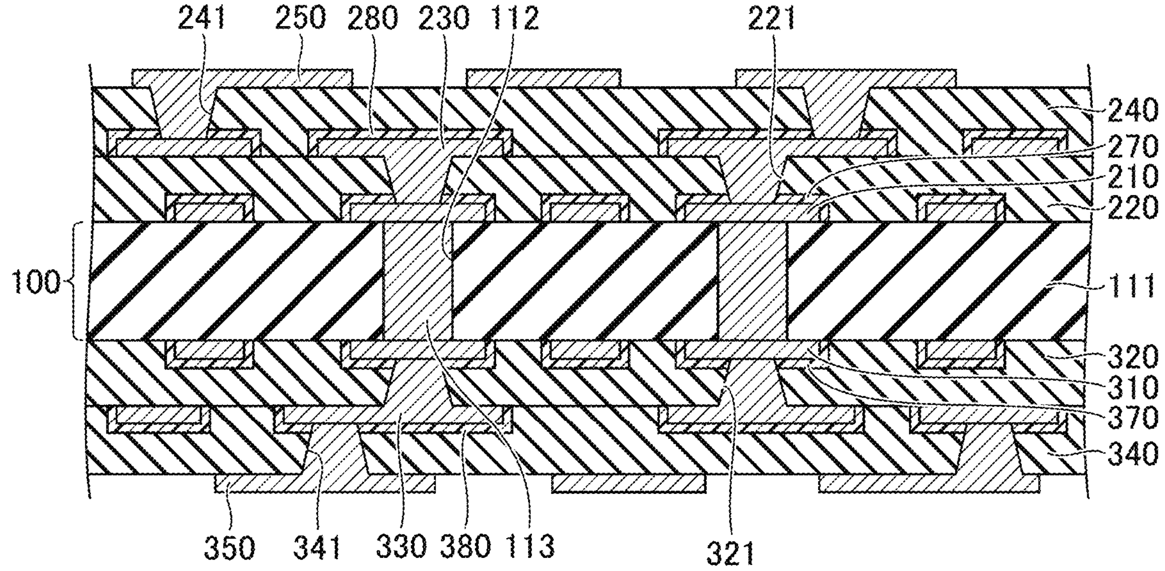
FIGS. 4A and 4B are cross-sectional views illustrating the method of making the interconnect substrate according to the embodiment.

As illustrated in FIG. 4A, via holes 241 reaching the interconnect layer 230 are formed through the insulating layer 240 and the adhesion enhancing film 280, and via holes 341 reaching the interconnect layer 330 are formed through the insulating layer 340 and the adhesion enhancing film 380. Subsequently, an interconnect layer 250 including via conductors in the via holes 241 and an interconnect pattern on the first surface of the insulating layer 240 is formed, and an interconnect layer 350 including via conductors in the via holes 341 and an interconnect pattern on the second surface of the insulating layer 340 is formed.

Figure 4B:
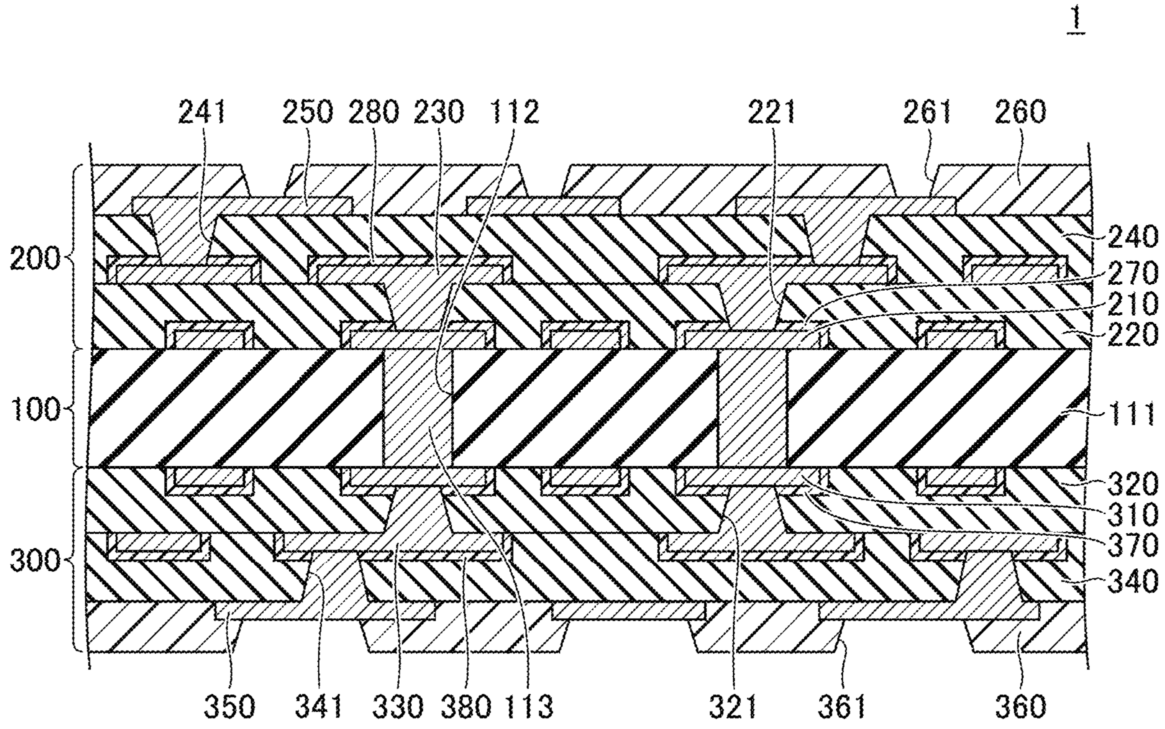

Subsequently, as illustrated in FIG. 4B, a solder resist layer 260 is formed on the insulating layer 240, and a solder resist layer 360 is formed beneath the insulating layer 340. Further, openings 261 are formed through the solder resist layer 260, and openings 361 are formed through the solder resist layer 360.

The above-described procedure enables the effective manufacture of the interconnect substrate 1 according to the embodiment.

In the interconnect substrate 1, the fact that the via conductor of the interconnect layer 230 is in contact with the first region 211 having high roughness ensures excellent adhesion between the interconnect layer 210 and the interconnect layer 230 due to the anchor effect. Further, the adhesion enhancing film 270 exists between the second region 212 and the insulating layer 220. This arrangement enables the provision of excellent adhesion between the interconnect layer 210 and the insulating layer 220 despite the fact that the roughness of the second region 212 is not as high as the roughness of the first region 211. If the roughness of the second region 212 were high, the reliability of the signal would possibly be degraded due to disturbance such as reflection of the signal in the second region 212. However, the present embodiment allows the second region 212 to have low roughness, thereby suppressing deterioration in the reliability of the signal. With respect to the interconnect layers 230, 310, and 330, deterioration in the reliability of the signal can also be suppressed while ensuring excellent adhesion, as in the case of the interconnect layer 210. The effect of suppressing deterioration in the reliability of the signal is more prominent as the frequency of the signal increases.

The manufacturing method described above allows the first region 211 and the second region 212 having different roughness to be easily provided on the upper surface 215 of the interconnect layer 210. Like the upper surface 215 of the interconnect layer 210, the upper surface of the interconnect layer 230, the lower surface of the interconnect layer 310, and the lower surface of the interconnect layer 330 can easily be provided with the first region and the second region having different roughness.

According to at least one embodiment of the disclosed technology, deterioration in signal reliability is effectively suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The present disclosures non-exhaustively include the subject matter set out in the following clauses.

Clause 1. A method of making an interconnect substrate, comprising:

forming a first interconnect layer having a surface;

forming an adhesion enhancing film covering the surface;

forming an insulating layer on the adhesion enhancing film;

forming, through the insulating layer, an opening reaching the adhesion enhancing film;

roughening an exposed portion of the adhesion enhancing film, the exposed portion being exposed from the opening;

forming a via hole by reverse-sputtering the surface through the roughened exposed portion, the via hole including the opening and reaching the surface; and forming, on the insulating layer, a second interconnect layer in contact with the surface through the via hole.

Clause 2. The method as recited in Clause 1, wherein the roughening the exposed portion includes irradiating the exposed portion with oxygen plasma.

Clause 3. The method as recited in Clause 1, wherein Argon ions are used for the reverse sputtering.

What is claimed is:

1. An interconnect substrate comprising:

a first interconnect layer having a surface, the surface including a first region and a second region;

an adhesion enhancing film covering the second region;

an insulating layer formed on the adhesion enhancing film;

a via hole formed through the insulating layer and the adhesion enhancing film to reach the first region; and a second interconnect layer formed on the insulating layer and in contact with the first region through the via hole, wherein a roughness of the first region is higher than a roughness of the second region.

2. The interconnect substrate as claimed in claim 1, wherein the adhesion enhancing film contains a silane coupling agent.

3. The interconnect substrate as claimed in claim 1, wherein an arithmetic average roughness of the first region is from 80 nm to 250 nm, and an arithmetic average roughness of the second region is from 10 nm to 100 nm.

4. The interconnect substrate as claimed in claim 1, wherein the second interconnect layer includes a seed layer and a plating layer, the seed layer being in contact with an inner surface of the via hole and the first region, and the plating layer being in contact with the seed layer and filing the via hole.

5. The interconnect substrate as claimed in claim 1, wherein the via hole has an inverted frustoconical shape, such that an opening diameter of the via hole at an upper side of the insulating layer is wider than an opening diameter of the via hole toward the first interconnect layer.

6. The interconnect substrate as claimed in claim 1, wherein the adhesion enhancing film is in physical contact with the second interconnect layer at a wall surface of the via hole.

* * * * *